United States Patent [19]

Graube

[11] Patent Number: 5,272,455
[45] Date of Patent: Dec. 21, 1993

[54] TRUNK CABLE COUPLING USING NON-LINEAR ELEMENTS

[75] Inventor: Maris Graube, Forest Grove, Oreg.

[73] Assignee: Relcom, Inc., Forest Grove, Oreg.

[21] Appl. No.: 890,031

[22] Filed: May 27, 1992

[51] Int. Cl.$^5$ .............................................. H01P 5/12
[52] U.S. Cl. ................................... 333/100; 333/136
[58] Field of Search ............... 333/100, 101, 124, 130, 333/131, 127, 136, 109

[56] References Cited

U.S. PATENT DOCUMENTS

| | | | |
|---|---|---|---|
| 2,738,464 | 3/1956 | Abbett | 333/131 |
| 3,671,885 | 6/1972 | Pennypacker | 333/131 |
| 3,832,647 | 8/1974 | Beurrier | 333/100 |
| 4,167,714 | 9/1979 | Flora | 333/101 |
| 4,365,215 | 12/1982 | Landry | 333/127 |
| 4,367,445 | 1/1983 | Dydyk | 333/127 |
| 4,823,096 | 4/1989 | Hash | 333/109 |
| 4,908,820 | 3/1990 | Ayasu | 333/100 |
| 5,097,234 | 3/1992 | Andresen | 333/131 |
| 5,204,644 | 4/1993 | Dalsida | 333/127 |
| 5,206,611 | 4/1993 | Russell | 333/127 |

Primary Examiner—Raymond A. Nelli
Attorney, Agent, or Firm—Chernoff, Vilhauer, McClung & Stenzel

[57] ABSTRACT

An interface circuit for coupling a drop port to a trunk line carrying data processing signals, includes a transformer network connected between the trunk line and that drop port and a resistor network connected between the trunk line and the drop port wherein the resistor network includes a non-linear switching circuit for attenuating high amplitude data processing signals from the drop port and for isolating the resistor network thereby permitting data processing signals carried by the trunk line to be routed directly to the drop port without attenuation.

12 Claims, 3 Drawing Sheets

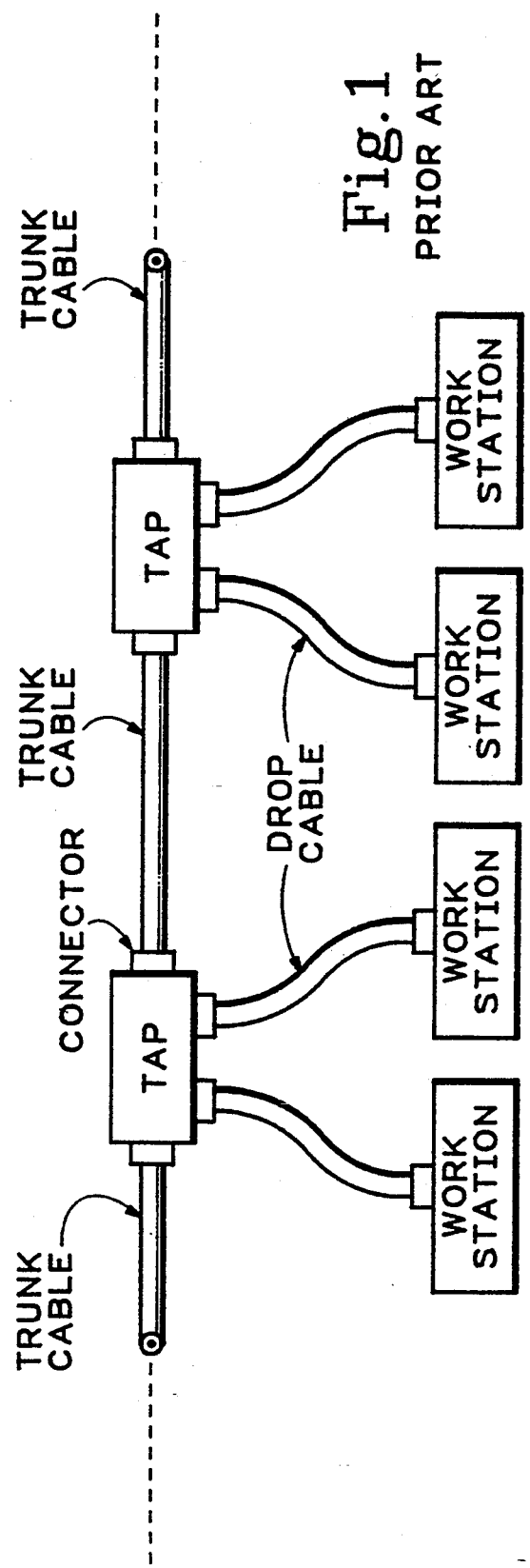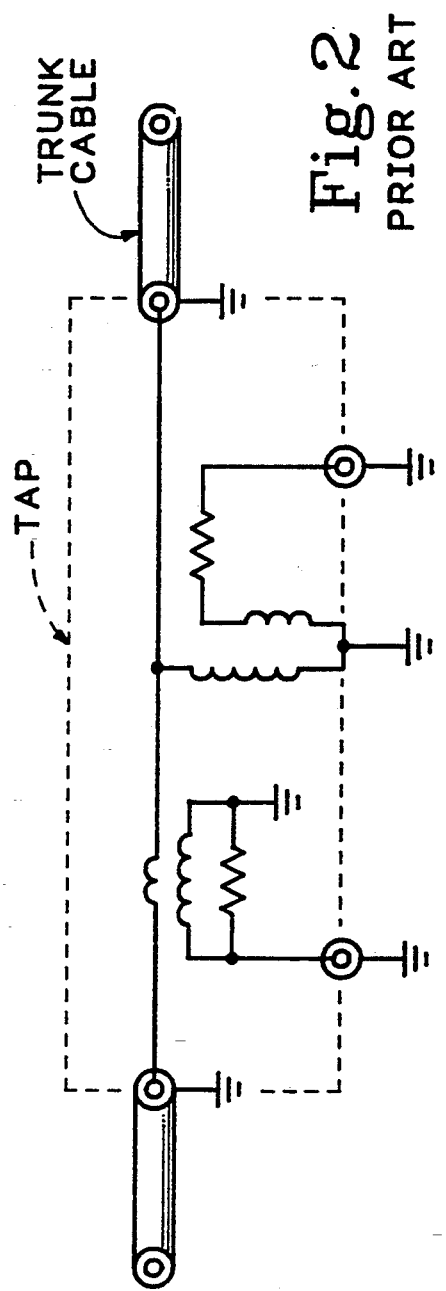

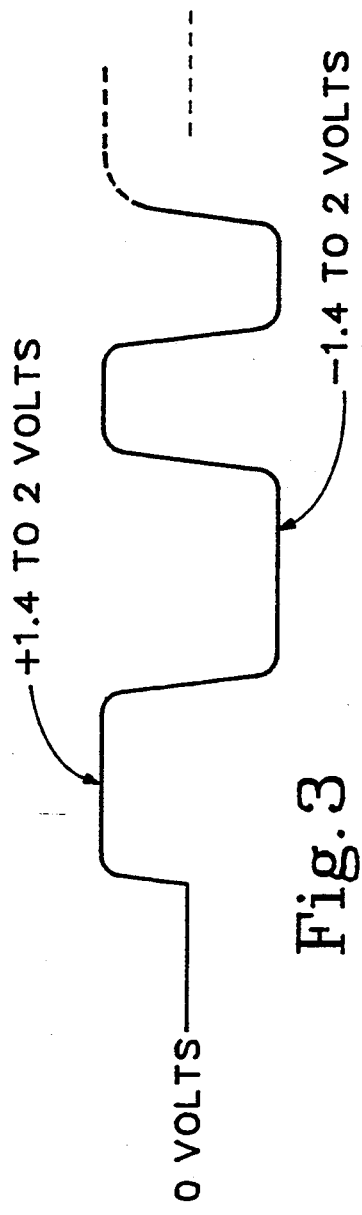
Fig.3
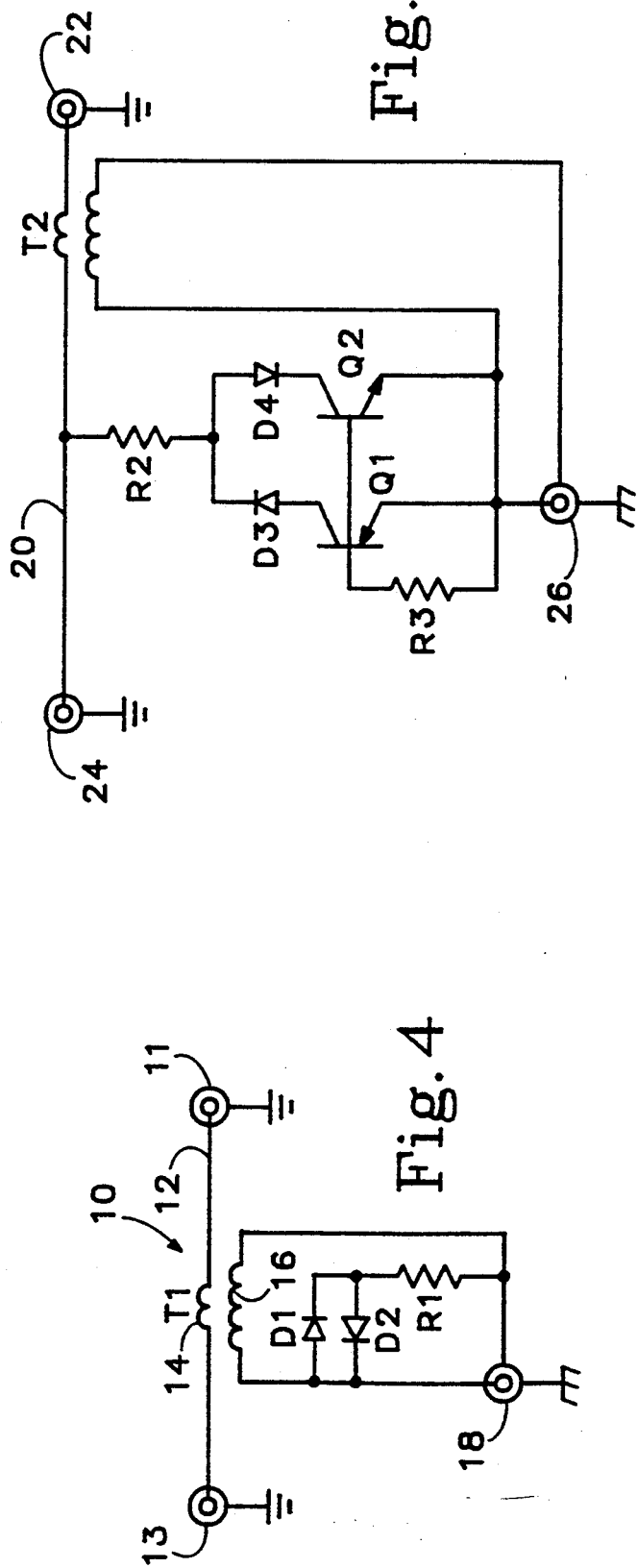
Fig.5
Fig.4

TRUNK CABLE COUPLING USING NON-LINEAR ELEMENTS

BACKGROUND OF THE INVENTION

The following invention relates to an interface or tap circuit for coupling a trunk line to a drop port and more particularly to an interface circuit employing non-linear circuit elements to provide for more efficient and more accurate coupling.

Local area networks employ a coaxial cable bus, sometimes termed a trunk line, to interconnect a number of data processing devices. Different types of such networks employ different standards for network parameters and one such standard is for a token bus network as defined in IEEE standard 802.4 and its identical international counterpart standard ISO 8802-4. This standard defines several technologies that can be used to distribute signals among the communicating drop ports or work stations that are connected to the network bus cable or trunk line. One of the technologies is called "carrierband."

A carrierband network employs a coaxial line as a bus or trunk cable to distribute signals among the plurality of stations, computers, or other data processing devices. Stations are connected to the trunk cable through taps by other coaxial cables frequently called drop cables. A tap may be connected to more than one drop cable.

The tap couples a signal transmitted by a station to the trunk cable such that equal amounts of the signal are sent in each direction on the trunk cable. Conversely a signal from either direction on the trunk cable passing through a tap is split such that a small portion of the signal is transferred to the drop cable and the attached work station while the remainder of the signal continues on the trunk cable.

A conventional trunk cable tap network heretofore employed in the prior art is shown in FIG. 1 in which a plurality of taps, which include connectors coupled in line at various places along a trunk cable, include two drop cables each connected to a separate work station.

The carrierband network standards referred to above define a number of requirements for such taps. One such requirement is that the tap must be passive; that is, it should not contain amplifiers or other powered devices. Also, the portion of the signal taken off the trunk cable and coupled to the drop cable should be −20 dB down from the trunk cable signal. Moreover the impedance of the connections of the tap should be 75 ohms to match the characteristic impedance of the trunk and the drop cable. The trunk cable connections at the tap should have very low reflection, typically less than −35 dB and no more than −20 dB reflection at the drop cable connections.

A schematic diagram of a tap frequently employed in the prior art which meets these requirements is shown in FIG. 2. Each tap includes an in-line transformer and an autotransformer connected to the trunk cable. The in-line transformer includes a resistor connected in series with its secondary coil and the autotransformer connection includes a terminating resistor connected in series between the autotransformer and a drop port.

While the configuration shown in FIG. 2 meets the requirements imposed by the IEEE standard, the resistors that must be used in order to provide impedance matching dissipate most of the signal energy from the drop cable. This makes the connection very inefficient. The inefficiency works both ways. The signal from a drop port is substantially attenuated by the terminating resistors. The result is that the number of data processing devices that can be connected to any particular trunk line is limited.

SUMMARY OF THE INVENTION

The present invention provides an interface circuit for coupling a drop port to a trunk line that carries data processing signals and includes a coupling transformer, a terminating resistor connected in parallel with the coupling transformer and a non-linear circuit element connected to both the transformer and the terminating resistor and having a threshold set so that the non-linear circuit element switches any high amplitude data processing signals generated at the drop port into the terminating resistor and permits the relatively weak signals received at the coupling transformer to be routed directly to the port without being dissipated in the terminating resistor. The non-linear circuit element may include, in its simplest form, a matched pair of diodes having a predetermined forward bias threshold so that the diodes are turned on by signals from the drop port but block signals from the trunk line so that there is no current flow into the parallel connected terminating resistor.

If desired, the interface circuit may comprise a pair of transistors which are self-powered. This has the advantage of placing even more signal on the trunk line. As a further enhancement to the system a surge protection capacitor may be employed to block DC or other low frequency phenomena that might occur on the trunk line. In addition a gaseous discharge device may be provided to protect the surge protection capacitor.

It is a primary object of this invention to provide a high efficiency tap which is capable of transferring signal energy from a drop port to a trunk cable connected to the tap without unnecessarily dissipating energy in the terminating resistor while preserving the necessary impedance matching characteristics of the tap.

A further object of this invention is to provide a tap for a trunk cable in which the required −20 dB of energy is transferred from the trunk cable to a drop port without the unnecessary dissipation of energy in a terminating resistor network.

Yet a further object of this invention is to provide ground current isolation and surge protection for the tap in order to protect data processing devices connected to the trunk line.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 is a partial schematic diagram of a conventional trunk cable with taps connected thereto.

FIG. 2 is a schematic diagram of a conventional prior art carrierband tap of the type used in FIG. 1.

FIG. 3 is a waveform diagram representing a typical carrierband signal.

FIG. 4 is a schematic diagram of one embodiment of the invention employing diodes as non-linear network elements.

FIG. 5 is a schematic diagram of a second embodiment of the invention employing transistors as non-linear network elements.

DETAILED DESCRIPTION OF THE INVENTION

Figure 7:
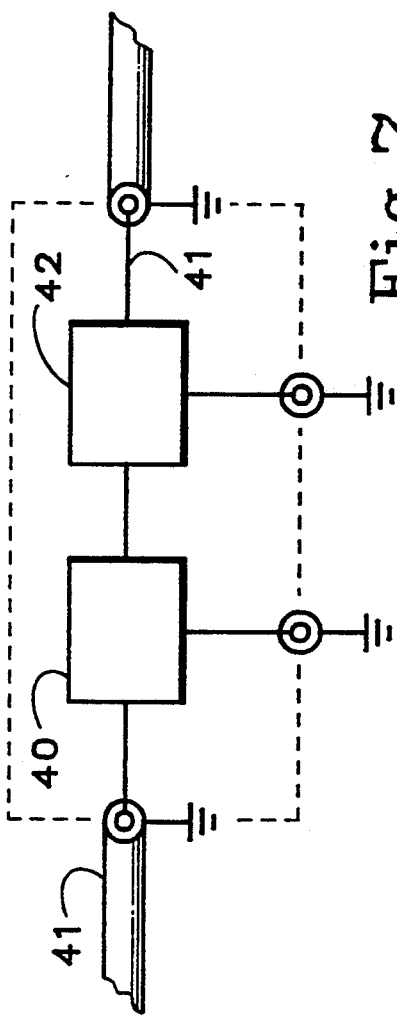
FIG. 7 is a block schematic diagram of a series arrangement of interface tap circuits employing the present invention.

Referring to FIG. 4 a tap interface circuit 10 includes a transformer T1 connected to a trunk line 12. The trunk line 12 extends between two ports 11 and 13 which represent connectors that insert the tap interface circuit 10 in series with the remainder of the trunk line (not shown). The transformer T1 consists of a primary coil 14 and a secondary coil 16 whose turns ratios are arranged so as to provide an attenuation of −20 dB of the signal from the trunk line 12 to a drop port 18. The drop port 18 provides access to any conventional data processing device that employs a carrierband signal of the type illustrated in FIG. 3. A diode-resistor network is connected in parallel with the secondary coil 16 and includes a diode pair comprising D1 and D2 both coupled to a resistor R1. The diodes D1 and D2 have forward bias voltages such that the waveform of FIG. 3 which represents a typical carrierband signal from a work station will turn on diodes D1 and D2 placing the terminating resistor R1 in the circuit for proper impedance matching.

By the same token, signals received from the trunk line 12 by the transformer T1 are transferred directly to the drop port 18 because the trunk line signals at −20 dB are too weak to overcome the thresholds of diodes D1 and D2. The result is that no energy is dissipated in the terminating resistor R1 and all of the energy from the trunk line 12 is transferred directly to the drop port 18.

The circuit of FIG. 4 provides a resistance-free path from the trunk cable to the drop port. However, signals from the drop port to the trunk cable are still attenuated by approximately −20 dB. That makes this particular configuration relatively inefficient since it would be desirable that more signal than −20 dB be transferred to the trunk line. By using the circuit of FIG. 5 greater efficiency can be obtained which provides for less attenuation of signals from the drop port. According to the embodiment of FIG. 5, a transformer T2 is coupled to a trunk line 20 which extends between coupling ports 22 and 24. As with the embodiment of FIG. 4, this tap interface circuit is intended to be coupled in-line with the remainder of the trunk line which is not shown. The secondary coil of the transformer T2 is coupled directly to a drop port 26 without any terminating resistor in the signal path. A terminating resistor R2 is also coupled to the trunk line 20. The resistor R2 is connected to two diodes D3 and D4. The diode D4 is in turn connected to the NPN transistor Q2 and the diode D3 is connected to the PNP transistor Q1. The transistors Q1 and Q2 are coupled in a common base mode to bias resistor R3. The bias resistor R3 and the emitters of the transistors Q1 and Q2 are connected to the drop port 26.

The arrangement of the diodes and transistors in FIG. 5 is such that the signals on the trunk cable have no effect on these components because they are blocked by diodes D3 and D4. The result is that any signal from the trunk cable is coupled to the drop port only through the transformer T2 thus ensuring that an optimum signal strength at −20 dB from the trunk cable signal is transferred to the port 26. It will be noted that there are no resistors in the signal path to dissipate any of the trunk cable signal.

When coupling the drop port 26 to the trunk cable 20 a positive polarity of the signal from the port 26 will turn on the PNP transistor Q1 and its corresponding diode D3. Similarly, a negative going signal will turn on the NPN transistor Q2 and its corresponding diode D4. The signal reaching the trunk cable 20 will be in the neighborhood of −10 dB not −20 dB, and the resistor R2 provides the necessary terminating impedance.

The circuits illustrated in both FIGS. 4 and 5 are constructed to provide ground isolation. Different symbols are used to denote ground for the trunk line and for the drop port to indicate that the grounds are indeed different. This provides a measure of ground isolation between the two circuits so that large unwanted currents do not flow from the trunk lines into the drop ports.

Figure 6:
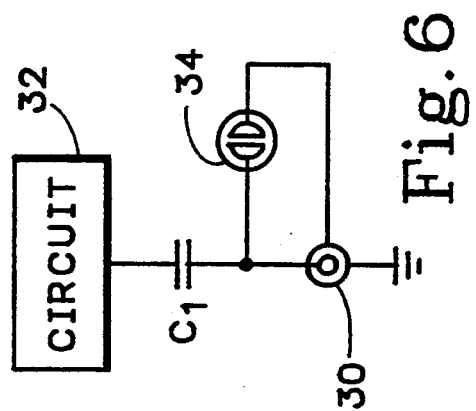
FIG. 6 is a schematic diagram of a surge protection circuit which may be coupled to either of the interface circuits of FIG. 4 or FIG. 5.

Lightning strikes or other electrical phenomena can sometimes cause large voltage excursions or surges on either trunk or drop cables. These surges are most always low frequency phenomena. There is an IEEE standard (No. 587) which characterizes these common occurrences as unipolar and having durations that are several orders of magnitude greater than the period of a typical carrierband network signal. As such the surges can be blocked by a capacitor C1 as shown in the circuit of FIG. 6 that is connected in series between a tap circuit and a drop port 30. The capacitance of capacitor C1 in FIG. 6 is such that it blocks low frequency surges and DC but allows the carrierband signal to pass between the drop port 30 and the tap circuit 32. A surge protection device 34 connected between the capacitor C1 and ground at the drop port 30 shunts voltages to ground that are sufficiently large to reach the trigger voltage of the surge protection device 34. The trigger voltage is usually on the order of 90 volts.

Figure 8:
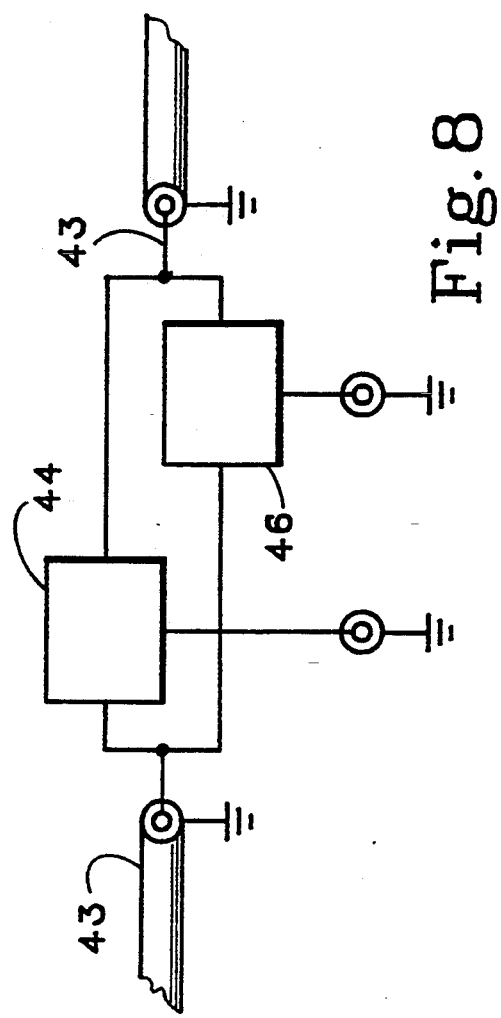
FIG. 8 is a block schematic diagram of a parallel arrangement of tap interface circuits.

The circuits of FIGS. 4 and 5 can be used in a variety of configurations as illustrated by the block schematic diagrams of FIGS. 7 and 8. FIG. 7 shows a series arrangement of tap circuits 40 and 42 connected to the trunk line 41. FIG. 8 shows tap circuits 44 and 46 connected in parallel to a trunk line 43. Either arrangement can be used with the circuits of FIGS. 4 or 5 without affecting the impedance seen by the trunk line.

Although the invention has been described by reference to non-linear components such as diodes and transistors, other types of non-linear circuit devices or switches may be employed. All that is necessary is that the switching device be self-triggering and that its threshold be set high enough so that signals from the trunk cable do not affect it. In this way the switching device isolates a terminating or impedance matching resistor from the trunk line and enables signals from the trunk line to pass directly from a matching transformer to a drop port without the dissipation of any energy in the resistor.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. An interface circuit for coupling a drop port to a trunk line carrying data processing signals comprising:
   (a) a coupling transformer connected to the trunk line;
   (b) a resistor connected in parallel with the coupling transformer; and
   (c) a non-linear circuit element connected to the transformer and to the resistor, and having a threshold set to switch high level data processing signals generated at the drop port into the resistor and to permit relatively weak signals received through the coupling transformer from the trunk line to be routed directly to the drop port without being dissipated by the resistor.

2. The interface circuit of claim 1 wherein the non-linear circuit element includes a pair of diodes.

3. The interface circuit of claim 1 wherein the non-linear circuit element includes a transistor pair.

4. The interface circuit of claim 1, further including a surge protection capacitor connected between the interface circuit and the drop port.

5. The interface circuit of claim 4, further including a surge protection device coupled between the surge protection capacitor and a ground connection.

6. An interface circuit for coupling a drop port to a trunk line carrying data processing signals comprising:
   (a) a transformer network connected between the trunk line and the drop port;
   (b) a resistor network connected between the trunk line and the drop port, the resistor network including switching circuit means for coupling high amplitude data processing signals from the drop port to the trunk line and for isolating the resistor network from data processing signals carried by the trunk line.

7. The interface circuit of claim 6 wherein the resistor network includes a resistor connected to the trunk line.

8. The interface circuit of claim 6 wherein the resistor network includes a resistor connected to the drop port in parallel with the transformer network.

9. The interface circuit of claim 8 wherein the switching circuit means comprises a diode pair connected in series with the resistor.

10. The interface circuit of claim 7 wherein the switching circuit means comprises a transistor pair connected in series with the resistor.

11. The interface circuit of claim 1 wherein the trunk line is connected to a first ground and the drop port is connected to a second ground and said first ground is isolated electrically from said second ground.

12. The interface circuit of claim 6, further including surge protection means for isolating the drop port from electrical surges.

* * * * *